(12) United States Patent
Hasegawa

(10) Patent No.: US 12,212,941 B2
(45) Date of Patent: Jan. 28, 2025

(54) SIGNAL PROCESSING APPARATUS AND SIGNAL PROCESSING METHOD

(71) Applicant: YAMAHA CORPORATION, Hamamatsu (JP)

(72) Inventor: Masatoshi Hasegawa, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 270 days.

(21) Appl. No.: 17/575,167

(22) Filed: Jan. 13, 2022

(65) Prior Publication Data

US 2022/0225025 A1 Jul. 14, 2022

(30) Foreign Application Priority Data

Jan. 14, 2021 (JP) ................. 2021-004199

(51) Int. Cl.
*H04R 3/04* (2006.01)
(52) U.S. Cl.
CPC ........... *H04R 3/04* (2013.01); *H04R 2420/01* (2013.01)
(58) Field of Classification Search
CPC .... H04R 3/04; H04R 2420/01; H03G 3/3005; H03G 3/301; H03G 3/3026; H03G 3/3089; H03F 2203/45522; H03F 3/187; H03F 3/45475; H03F 2200/03

USPC ........................................... 381/94.7
See application file for complete search history.

(56) References Cited

U.S. PATENT DOCUMENTS

2018/0242083 A1* 8/2018 Lindemann ............. H04R 3/04
2019/0229692 A1* 7/2019 Sahara ................. H03G 3/3089

FOREIGN PATENT DOCUMENTS

WO 2019069439 A1 4/2019

* cited by examiner

*Primary Examiner* — Carolyn R Edwards
*Assistant Examiner* — Friedrich Fahnert
(74) *Attorney, Agent, or Firm* — ROSSI, KIMMS & McDOWELL LLP

(57) ABSTRACT

A signal processing apparatus includes a first signal processing circuit configured to generate a first sound signal based on an input signal, and a second signal processing circuit configured to generate a second sound signal based on the first sound signal. In a case that a gain of the first signal processing circuit is switched, the second signal processing circuit generates, for a predetermined time after the gain of the first signal processing circuit is switched, a value of the second sound signal based on a value of the first sound signal at or before a timing of the gain of the first signal processing circuit being switched.

6 Claims, 2 Drawing Sheets

SIGNAL PROCESSING APPARATUS AND SIGNAL PROCESSING METHOD

CROSS-REFERENCE TO RELATED APPLICATIONS

This application is based on and claims priority under 35 USC 119 from Japanese Patent Application No. 2021-004199 filed on Jan. 14, 2021, the contents of which are incorporated herein by reference.

TECHNICAL FIELD

The present disclosure relates to a signal processing apparatus and a signal processing method suitable for an amplifier, a mixer, and the like.

BACKGROUND ART

In a signal processing apparatus such as an amplifier capable of performing gain switching, stepwise noise is generated in an output signal at the time of gain switching. In a technique disclosed in WO2019/069439, in order to reduce such stepwise noise, at the time of switching a gain of an amplifier, a total gain value is gradually changed over a predetermined time by correcting the gain.

Among amplifiers, there is, for example, a combination of an amplifier using an analog circuit and an amplifier using a digital circuit. Here, the amplifier using the analog circuit has a configuration in which gain switching is performed by a switch, and in this type of amplifier, impulse-like noise is generated in an output signal at the time of gain switching. The technique disclosed in WO2019/069439 has a problem in that such impulse-like noise cannot be removed and the impulse-like noise is generated in a final output signal.

SUMMARY OF INVENTION

The present disclosure is made in view of the above circumstances, and an object of the present disclosure is to provide a signal processing device and a signal processing method capable of reducing an influence of noise generated in association with gain switching in an output signal.

Aspect of non-limiting embodiments of the present disclosure relates to provide a signal processing apparatus including: a first signal processing circuit configured to generate a first sound signal based on an input signal, and a second signal processing circuit configured to generate a second sound signal based on the first sound signal. In a case that a gain of the first signal processing circuit is switched, the second signal processing circuit generates, for a predetermined time after the gain of the first signal processing circuit is switched, a value of the second sound signal based on a value of the first sound signal at or before a timing of the gain of the first signal processing circuit being switched.

Another aspect of non-limiting embodiments of the present disclosure relates to provide a signal processing method including: generating a first sound signal based on an input signal, generating a second sound signal based on the first sound signal, and in a case that a gain is switched in the generating the first sound signal and (ii) for a predetermined time after the gain is switched, a value of the second sound signal based on a value of the first sound signal at or a before a timing of the gain being switched.

DESCRIPTION OF EMBODIMENTS

Hereinafter, an embodiment of the present disclosure will be described with reference to the drawings.

Figure 1:
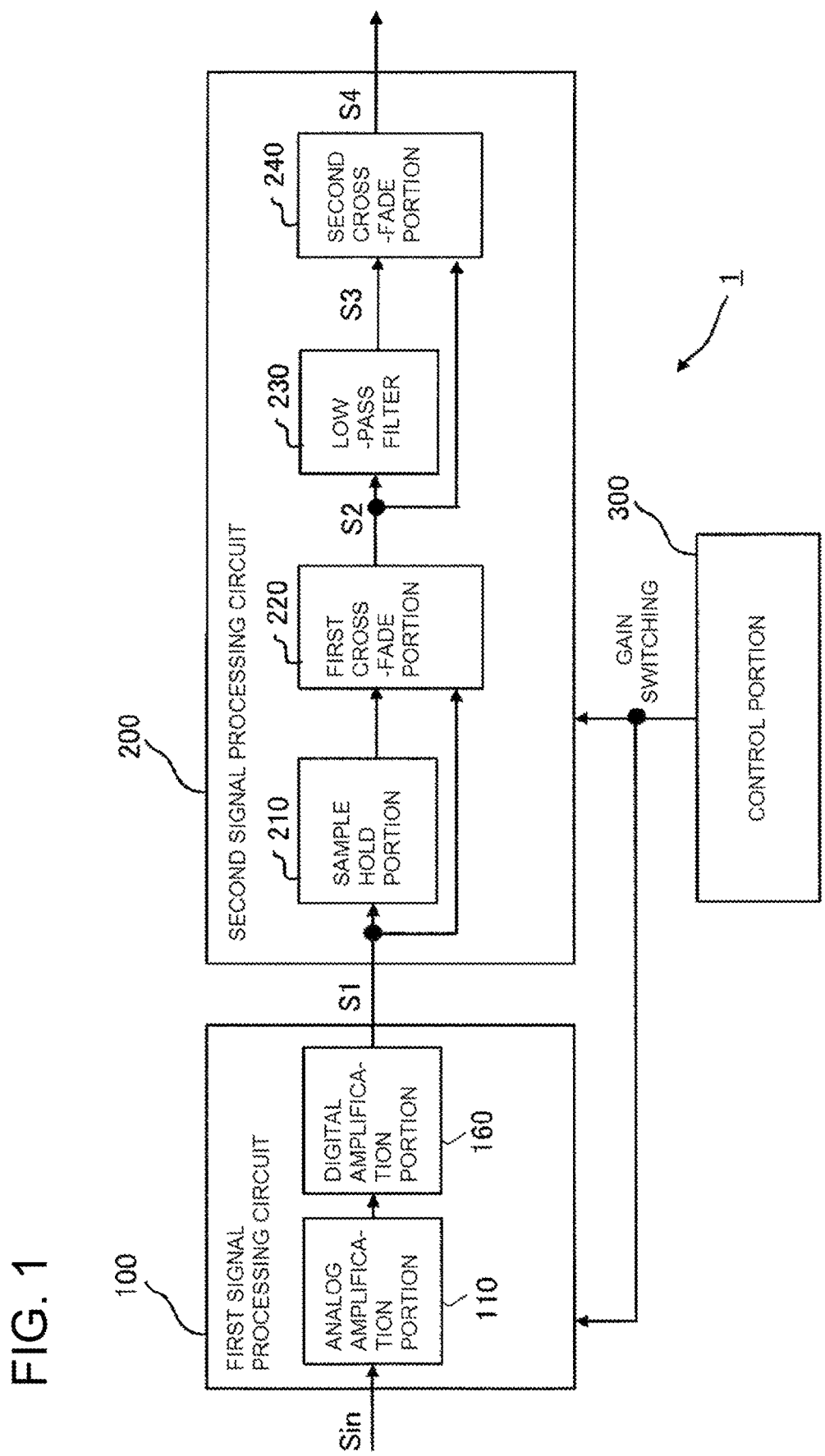
FIG. 1 is a block diagram showing a configuration of a signal processing apparatus according to an embodiment of the present disclosure.

FIG. 1 is a block diagram showing a configuration of a signal processing apparatus 1 according to the embodiment of the present disclosure. As shown in FIG. 1, the signal processing apparatus 1 includes a first signal processing circuit 100, a second signal processing circuit 200, and a control portion 300.

The first signal processing circuit 100 generates a first sound signal S1 which is a digital sound signal from an input signal Sin. The input signal Sin is an analog sound signal or the like picked up by a microphone. The first signal processing circuit 100 includes an analog amplification portion 110 and a digital amplification portion 160. Under control of the control portion 300, the analog amplification portion 110 performs analog amplification on the input signal Sin, performs A/D conversion on the input signal Sin, and outputs the input signal Sin. Under the control of the control portion 300, the digital amplification portion 160 performs digital amplification on the output signal of the analog amplification portion 110 and outputs the amplified signal as the first sound signal S1.

The signal processing apparatus 1 is a circuit that amplifies the input signal Sin as a whole. A total gain of the signal processing apparatus 1 as a whole is a gain obtained by adding an analog gain (dB) of the analog amplification portion 110 and a digital gain (dB) of the digital amplification portion 160 in the first signal processing circuit 100.

An instruction of the total gain of the signal processing apparatus 1 is given to the control portion 300 by an operation of an operation device (not shown) or the like. When the total gain of the signal processing apparatus 1 is switched from, for example, a total gain TG1 to a total gain TG2, the control portion 300 instructs the analog amplification portion 110 and the digital amplification portion 160 to provide the analog gain and the digital gain for implementing the total gain TG2 after the switching.

A reason why the analog amplification performed by the analog amplification portion 110 and the digital amplification performed by the digital amplification portion 160 are performed on the input signal Sin is as follows.

Figure 2:
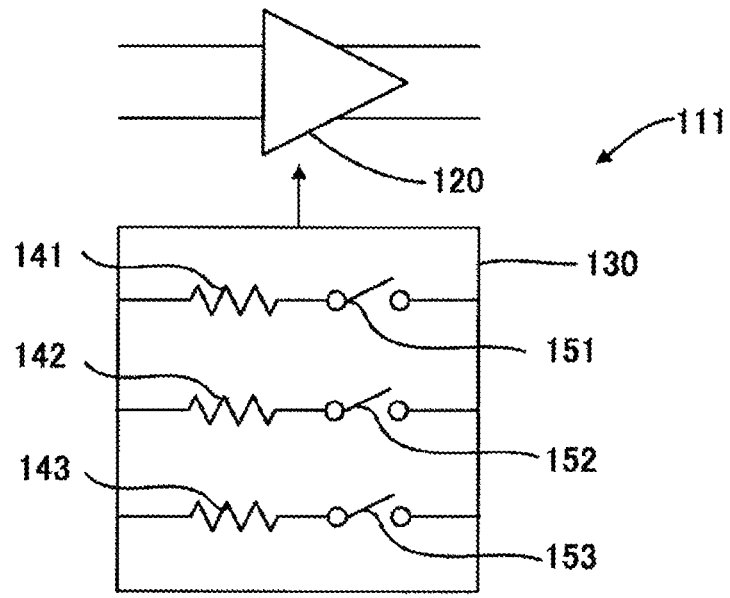
FIG. 2 is a circuit diagram showing a configuration example of an analog amplification portion in the signal processing apparatus.

FIG. 2 is a circuit diagram showing a configuration example of an analog amplification unit 111 which is a part of the analog amplification portion 110. The analog amplification portion 110 has a configuration in which the analog amplification units 111 are connected in multiple stages.

The analog amplification unit 111 includes an amplification unit 120 and a negative feedback circuit 130 which is connected to the amplification unit 120. the amplification unit 120 is configured by an operational amplifier. Here, the negative feedback circuit 130 includes resistors 141, 142, 143 having resistance values different from one another, and switches 151, 152, 153 that switch whether these resistors are respectively connected between input and output terminals of the amplification unit 120.

In the analog amplification unit 111, based on the analog gain instructed from the control portion 300, one or a plurality of switches among the switches 151, 152, 153 are turned on, a resistance value between the input and output terminals of the amplification unit 120 is switched, and a gain of the analog amplification unit 111 is determined. The same operation is performed in other analog amplification units 111 connected in multiple stages, and the analog gain of the analog amplification portion 110 becomes the analog gain instructed by the control portion 300.

In the analog amplification portion 110, in order to improve accuracy of the gain switching (step width of gain switching), it is necessary to make the analog amplification portion 110 large in scale. However, this is difficult. Therefore, in the present embodiment, the digital amplification portion 160, which is an amplification circuit using a digital circuit, is provided at a subsequent stage of the analog amplification portion 110, so that the digital amplification portion 160 performs fine adjustment of the gain that cannot be implemented by the analog amplification portion 110.

In addition, the digital amplification portion 160 has a function of reducing stepwise noise appearing in the first sound signal S1 to be output by the first signal processing circuit 100 under the control of the control portion 300 at the time of switching the total gain.

More specifically, at the time of switching the total gain, the control portion 300 obtains the analog gain and the digital gain for implementing the total gain TG2 after the switching, and instructs the analog amplification portion 110 to provide the analog gain.

In addition, at the time of switching the total gain, the control portion 300 obtains a digital gain DG1 for implementing the total gain TG1 before switching, a digital gain DG2 for implementing the total gain TG2 after switching, and a gain step ΔDG obtained by dividing a difference DG2−DG1 between the digital gains DG1 and DG2 by a predetermined number of steps N. Then, the control portion 300 repeats a process of changing the digital gain provided by instructing to the digital amplification portion 160 from the initial value DG1 to the final value DG2 by the gain step ΔDG at a predetermined time interval.

In this manner, at the time of gain switching, the control portion 300 gradually changes the total gain of the first signal processing circuit 100 from the total gain TG1 before switching to the total gain TG2 after switching over time, and reduces the stepwise noise appearing in the first sound signal S1 to be output by the first signal processing circuit 100.

As shown in FIG. 1, the second signal processing circuit 200 includes a sample hold portion 210, a first cross-fade portion 220, a low-pass filter 230, and a second cross-fade portion 240. The second signal processing circuit 200 is a circuit that removes noise from the first sound signal S1 output by the first signal processing circuit 100.

A portion including the sample hold portion 210 and the first cross-fade portion 220 constitutes a circuit for generating a second sound signal S2 from the first sound signal S1. The portion including the sample hold portion 210 and the first cross-fade portion 220 has a function of preventing passage of impulse-like noise appearing in the first sound signal S1 output by the first signal processing circuit 100 at the time of gain switching.

Here, the impulse-like noise appearing in the first sound signal S1 will be described. In the analog amplification unit 111 (FIG. 2) in the analog amplification portion 110, for example, only the switch 151 is turned on in order to implement the total gain TG1 before switching, and only the switch 152 is turned on in order to implement the total gain TG2 after switching. In this case, at the time of gain switching, when a switching timing of the switch 151 from being turned on to being turned off and a switching timing of the switch 152 from being turned off to being turned on do not coincide with each other, a state in which both of the switches 151 and 152 are turned on or a state in which both of the switches 151 and 152 are turned off occurs instantaneously. Due to such an instantaneous occurrence state, the total gain of the first signal processing circuit 100 instantaneously changes, so that the impulse-like noise is generated in the first sound signal S1.

In order to prevent the passage of the impulse-like noise, when the switching of the total gain of the first signal processing circuit 100 (specifically, a first switching of a stepwise gain switching) is detected, the portion including the sample hold portion 210 and the first cross-fade portion 220 generates a value of the second sound signal S2 based on a value of the first sound signal S1 at a gain switching timing for a predetermined time after the switching is detected.

More specifically, when it is detected that the gain of the first signal processing circuit 100 is switched, the sample hold portion 210 holds the value of the first sound signal S1 at the gain switching timing or holds the value of the first sound signal S1 at the timing before the gain is switched.

The first cross-fade portion 220 generates the value of the second sound signal S2 by performing first mixing (cross-fade in this example) of the value of the first sound signal S1 at the gain switching timing, that is, the value of the first sound signal S1 held by the sample hold portion 210 and the value of the first sound signal S1 generated by the first signal processing circuit 100 for the predetermined time after the timing at which the gain switching is detected.

Specifically, the first cross-fade portion 220 generates a coefficient r that monotonously change from 0 to 1 over the predetermined time and a coefficient 1−r, and outputs a value obtained by adding a value obtained by multiplying the first sound signal S1 held by the sample hold portion 210 by the coefficient 1−r and a value obtained by multiplying the first sound signal S1 output from the first signal processing circuit 100 by the coefficient r over the predetermined time. In this manner, the first cross-fade portion 220 increases a ratio of the value of the first sound signal S1 generated by the first signal processing circuit 100 in the second sound signal S2 obtained by the first mixing with the lapse of time. Accordingly, it is possible to obtain the second sound signal in which the impulse-like noise generated in association with the gain switching is prevented.

In the second signal processing circuit 200, a portion including the low-pass filter 230 and the second cross-fade portion 240 constitutes a circuit that generates a third sound signal S3 and a fourth sound signal S4 based on second sound signal S2. The portion including the low-pass filter 230 and the second cross-fade portion 240 has a function of preventing noise generated in the second sound signal S2 when the total gain of the first signal processing circuit 100 changes linearly (more specifically, in a fine stepwise manner) at the time of gain switching.

The low-pass filter 230 selects a low-pass component in the second sound signal S2 and generates the third sound signal S3. The second cross-fade portion 240 performs second mixing of the second sound signal S2 and the third sound signal S3 to generate the fourth sound signal S4. More specifically, the second cross-fade portion 240 generates a coefficient s that monotonously change from 0 to 1 over a predetermined time when the gain switching is detected and a coefficient 1−s, and outputs a value obtained by adding a value obtained by multiplying the third sound signal S3 output from the low-pass filter 230 by the coefficient 1−s and a value obtained by multiplying the second sound signal S2 by the coefficient s over the predetermined time. In this manner, the second cross-fade portion 240 increases a ratio of the value of the second sound signal S2 in the fourth sound signal S4 obtained by the second mixing with the lapse of time. Then, the fourth sound signal S4 becomes a final output signal of the signal processing apparatus 1.

Figure 3:
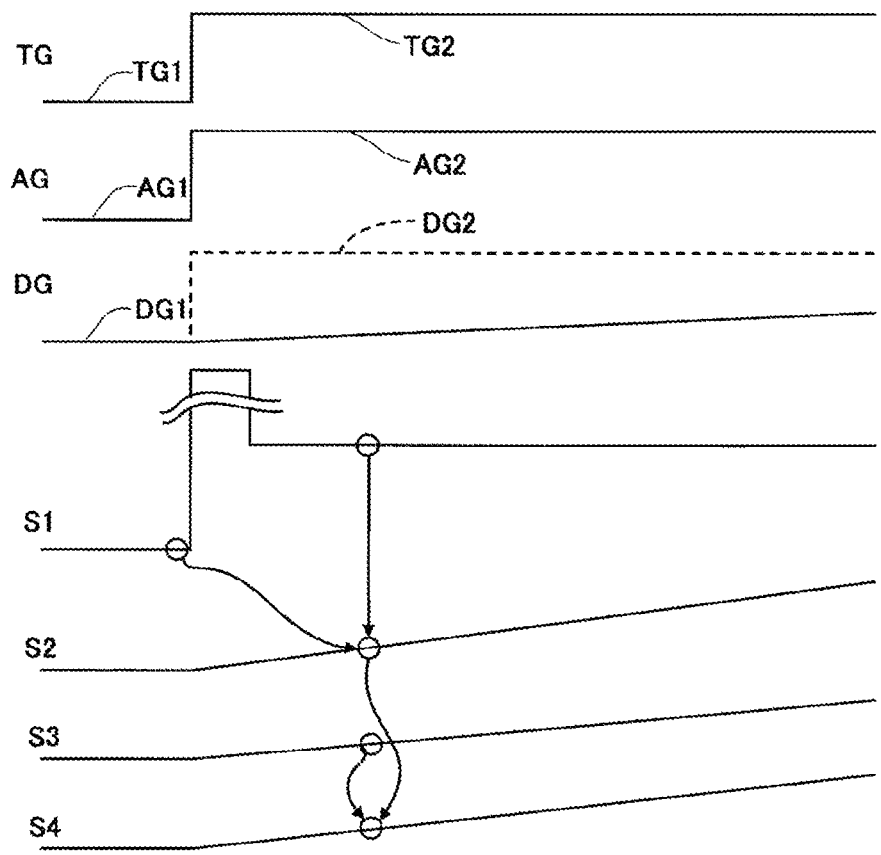
FIG. 3 is a time chart showing operations in the embodiment.

FIG. 3 is a time chart showing operations of each device of the signal processing apparatus 1. When the total gain TG of the first signal processing circuit 100 is switched from the total gain TG1 to the total gain TG2, the control portion 300 instructs the analog amplification portion 110 to switch an analog gain AG. Specifically, the control portion 300 instructs the analog amplification portion 110 to switch from an analog gain AG1 for implementing the total gain TG1 before switching to an analog gain AG2 for implementing the total gain TG2 after switching. Further, at the time of switching the total gain, the control portion 300 starts control of gradually changing a digital gain DG of the digital amplification portion 160 from the digital gain DG1 for implementing the total gain TG1 before switching to the digital gain DG2 for implementing the total gain TG2 after switching.

In the example shown in FIG. 3, when the analog gain AG of the analog amplification portion 110 is switched from the analog gain AG1 to the analog gain AG2, the impulse-like noise is generated in the first sound signal S1. In order to prevent the passage of the impulse-like noise, in the present embodiment, the sample hold portion 210 holds the value of the first sound signal S1 at the timing at which the gain switching of the first signal processing circuit 100 is detected. For a predetermined time thereafter, the first cross-fade portion 220 generates the value of the second sound signal S2 by performing the first mixing of the value of the first sound signal S1 output by the first signal processing circuit 100 and the value of the first sound signal S1 held by the sample hold portion 210. The ratio of the value of the first sound signal S1 output by the first signal processing circuit 100 in the second sound signal S2 is increased with the lapse of time. By such processing, the passage of the impulse-like noise generated in the first sound signal S1 is prevented.

When the analog gain AG of the analog amplification portion 110 is switched from the analog gain AG1 to the analog gain AG2, the second cross-fade portion 240 starts the process of generating the fourth sound signal S4 by performing the second mixing of the second sound signal S2 and the third sound signal S3 output by the low-pass filter 230. The ratio of the second sound signal S2 in the fourth sound signal S4 is increased with the lapse of time. By such processing, the noise in the fourth sound signal S4 that is caused by the gain switching is reduced.

As described above, according to the present embodiment, it is possible to reduce an influence of the noise generated in association with the gain switching on the output signal.

Although an embodiment of the present disclosure is described above, the present disclosure may include other embodiments. For example, the present disclosure includes the following embodiments.

(1) In the above embodiment, the first signal processing circuit 100 includes the analog amplification portion 110 and the digital amplification portion 160, but the first signal processing circuit 100 may have any configuration, and the entire first signal processing circuit 100 may be configured by analog circuits.

(2) In the above embodiment, the second signal processing circuit 200 may be implemented by a digital circuit or an analog circuit. The second signal processing circuit 200 may be implemented by a processor that executes a program.

(3) The present disclosure can also be implemented as a program that causes a processor to function as the signal processing apparatus 1 of the above-described embodiment.

What is claimed is:

1. A signal processing apparatus comprising:
a first signal processing circuit configured to generate a first sound signal based on an input signal; and
a second signal processing circuit configured to generate a second sound signal based on the first sound signal,
wherein in a case that a gain of the first signal processing circuit is switched, the second signal processing circuit generates, for a predetermined time after the gain of the first signal processing circuit is switched, a value of the second sound signal based on (i) a value of the first sound signal at or before a timing of the gain of the first signal processing circuit being switched and (ii) a value of the first sound signal generated by the first signal processing circuit after the gain of the first signal processing circuit is switched,
wherein the second signal processing circuit includes a low-pass filter configured to generate a third sound signal based on the second sound signal, the second signal processing circuit being further configured to generate a fourth sound signal by performing a mixing of the value of the second sound signal and a value of the third sound signal, and
wherein, in the mixing of the value of the second sound signal and the value of the third sound signal, a ratio of the value of the second sound signal to the value of the third sound signal increases with a lapse of time.

2. The signal processing apparatus according to claim 1, wherein the second signal processing circuit generates, for the predetermined time after the gain of the first signal processing circuit is switched, the value of the second sound signal by performing a mixing of the value of the first sound signal at or before the timing of the gain of the first signal processing circuit being switched and the value of the first sound signal generated by the first signal processing circuit after the gain of the first signal processing circuit is switched.

3. The signal processing apparatus according to claim 2, wherein, in the mixing of the value of the first sound signal at or before the timing of the gain of the first signal processing circuit being switched and the value of the first sound signal generated by the first signal processing circuit after the gain of the first signal processing circuit is switched, a ratio of the value of the first sound signal generated by the first signal processing circuit after the gain of the first signal processing circuit is switched to the value of the first sound signal at or before the timing of the gain of the first signal processing circuit being switched increases with a lapse of time.

4. A signal processing method comprising:
generating a first sound signal based on an input signal;
generating a second sound signal based on the first sound signal;
generating, (i) in a case that a gain is switched in the generating the first sound signal and (ii) for a predetermined time after the gain is switched, a value of the second sound signal based on (iii) a value of the first sound signal at or before a timing of the gain being switched and (iv) a value of the first sound signal generated after the gain is switched;

generating a third sound signal based on the second sound signal by a low-pass filter process; and generating a value of a fourth sound signal by performing a mixing of the value of the second sound signal and a value of the third sound signal, wherein, in the mixing of the value of the second sound signal and a value of the third sound signal, a ratio of the value of the second sound signal to the value of the third sound signal increases with a lapse of time.

5. The signal processing method according to claim 4, wherein generating the value of the second sound signal based on the value of the first sound signal at or before the timing of the gain being switched includes performing a mixing of the value of the first sound signal at or before the timing of the gain being switched and the value of the first sound signal generated after the gain is switched.

6. The signal processing method according to claim 5, wherein, in the mixing of the value of the first sound signal at or before the timing of the gain being switched and the value of the first sound signal generated after the gain is switched, a ratio of the value of the first sound signal generated after the gain is switched to the value of the first sound signal at or before the timing of the gain being switched increases with a lapse of time.

* * * * *